(12) United States Patent
Lin et al.

(10) Patent No.: US 11,527,537 B2
(45) Date of Patent: Dec. 13, 2022

(54) MEMORY STRUCTURE AND MANUFACTURING METHOD THEREOF

(71) Applicant: Winbond Electronics Corp., Taichung (TW)

(72) Inventors: Keng-Ping Lin, Taichung (TW); Shu-Ming Li, Taichung (TW); Tzu-Ming Ou Yang, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 17/306,874

(22) Filed: May 3, 2021

(65) Prior Publication Data
US 2022/0352172 A1    Nov. 3, 2022

(51) Int. Cl.
*H01L 27/108*    (2006.01)
(52) U.S. Cl.
CPC .. *H01L 27/10814* (2013.01); *H01L 27/10888* (2013.01); *H01L 27/10897* (2013.01)
(58) Field of Classification Search
None
See application file for complete search history.

(56) References Cited

U.S. PATENT DOCUMENTS

| | | | | |
|---|---|---|---|---|
| 5,362,666 | A | * 11/1994 | Dennison | H01L 27/10817 438/970 |
| 5,895,239 | A | * 4/1999 | Jeng | H01L 27/10852 257/E21.654 |
| 6,136,643 | A | * 10/2000 | Jeng | H01L 28/91 438/254 |
| 8,188,529 | B2 | 5/2012 | Nakamura et al. | |
| 2016/0233218 | A1 | 8/2016 | Mikasa | |
| 2021/0125993 | A1* | 4/2021 | An | H01L 28/90 |
| 2021/0272961 | A1* | 9/2021 | Tung | H01L 27/10894 |
| 2021/0398982 | A1* | 12/2021 | Li | H01L 27/10814 |
| 2022/0037325 | A1* | 2/2022 | Kang | H01L 27/10852 |

FOREIGN PATENT DOCUMENTS

| | | |
|---|---|---|
| CN | 112117276 | 12/2020 |
| CN | 112530947 | 3/2021 |
| JP | 2015216174 | 12/2015 |
| TW | 200625548 | 7/2006 |

(Continued)

OTHER PUBLICATIONS

"Office Action of Taiwan Counterpart Application", dated Nov. 22, 2021, p. 1-p. 6.

*Primary Examiner* — Steven M Christopher
(74) *Attorney, Agent, or Firm* — JCIPRNET

(57) ABSTRACT

A memory structure including a substrate, a bit line structure, a contact structure, a stop layer, and a capacitor structure is provided. The substrate includes a memory array region. The bit line structure is located in the memory array region and located on the substrate. The contact structure is located in the memory array region and located on the substrate on one side of the bit line structure. The stop layer is located in the memory array region and located above the bit line structure. The capacitor structure is located in the memory array region. The capacitor structure passes through the stop layer and is electrically connected to the contact structure. A bottom surface of the capacitor structure is lower than a bottom surface of the stop layer.

7 Claims, 9 Drawing Sheets

(56) References Cited

FOREIGN PATENT DOCUMENTS

| | | |
|---|---|---|
| TW | 200744162 | 12/2007 |
| TW | 201101425 | 1/2011 |
| TW | 201340253 | 10/2013 |
| TW | 201639081 | 11/2016 |
| TW | 201711022 | 3/2017 |
| TW | 202038386 | 10/2020 |
| TW | I713156 | 12/2020 |
| TW | I735860 | 8/2021 |

* cited by examiner

MEMORY STRUCTURE AND MANUFACTURING METHOD THEREOF

BACKGROUND OF THE INVENTION

Field of the Invention

The invention relates to a semiconductor structure and a manufacturing method therefore, and particularly relates to a memory structure and a manufacturing method thereof.

Description of Related Art

Currently, a memory structure has been developed, which includes a transistor and a capacitor coupled to each other. In this memory structure, the capacitor is used as a storage component. Therefore, how to increase the capacitance of the capacitor to improve the electrical performance of the memory device is the goal of continuous efforts.

SUMMARY OF THE INVENTION

The invention provides a memory structure and a manufacturing method thereof, which can effectively increase the capacitance of the capacitor structure, thereby improving the electrical performance of the memory device.

The invention provides a memory structure, which includes a substrate, a bit line structure, a contact structure, a stop layer, and a capacitor structure. The substrate includes a memory array region. The bit line structure is located in the memory array region and located on the substrate. The contact structure is located in the memory array region and located on the substrate on one side of the bit line structure. The stop layer is located in the memory array region and located above the bit line structure. The capacitor structure is located in the memory array region. The capacitor structure passes through the stop layer and is electrically connected to the contact structure. The bottom surface of the capacitor structure is lower than the bottom surface of the stop layer.

The invention provides a manufacturing method of a memory structure, which includes the following steps. A substrate is provided. The substrate includes a memory array region. A bit line structure is formed in the memory array region. The bit line structure is located on the substrate. A contact structure is formed in the memory array region. The contact structure is located on the substrate on one side of the bit line structure. A stop layer is formed in the memory array region. The stop layer is located above the bit line structure. A capacitor structure is formed in the memory array region. The capacitor structure passes through the stop layer and is electrically connected to the contact structure. The bottom surface of the capacitor structure is lower than the bottom surface of the stop layer.

Based on the above description, in the memory structure and a manufacturing method thereof according to the invention, since the bottom surface of the capacitor structure is lower than the bottom surface of the stop layer, the overall height of the capacitor structure can be increased, thereby increasing the capacitor area of the capacitor structure. Therefore, the capacitance of the capacitor structure can be effectively increased, thereby improving the electrical performance of the memory device.

In order to make the aforementioned and other objects, features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 1A to FIG. 1I are cross-sectional views illustrating a manufacturing process of a memory structure according to an embodiment of the invention.

DESCRIPTION OF THE EMBODIMENTS

FIG. 1A to FIG. 1I are cross-sectional views illustrating a manufacturing process of a memory structure according to an embodiment of the invention.

Figure 1A:
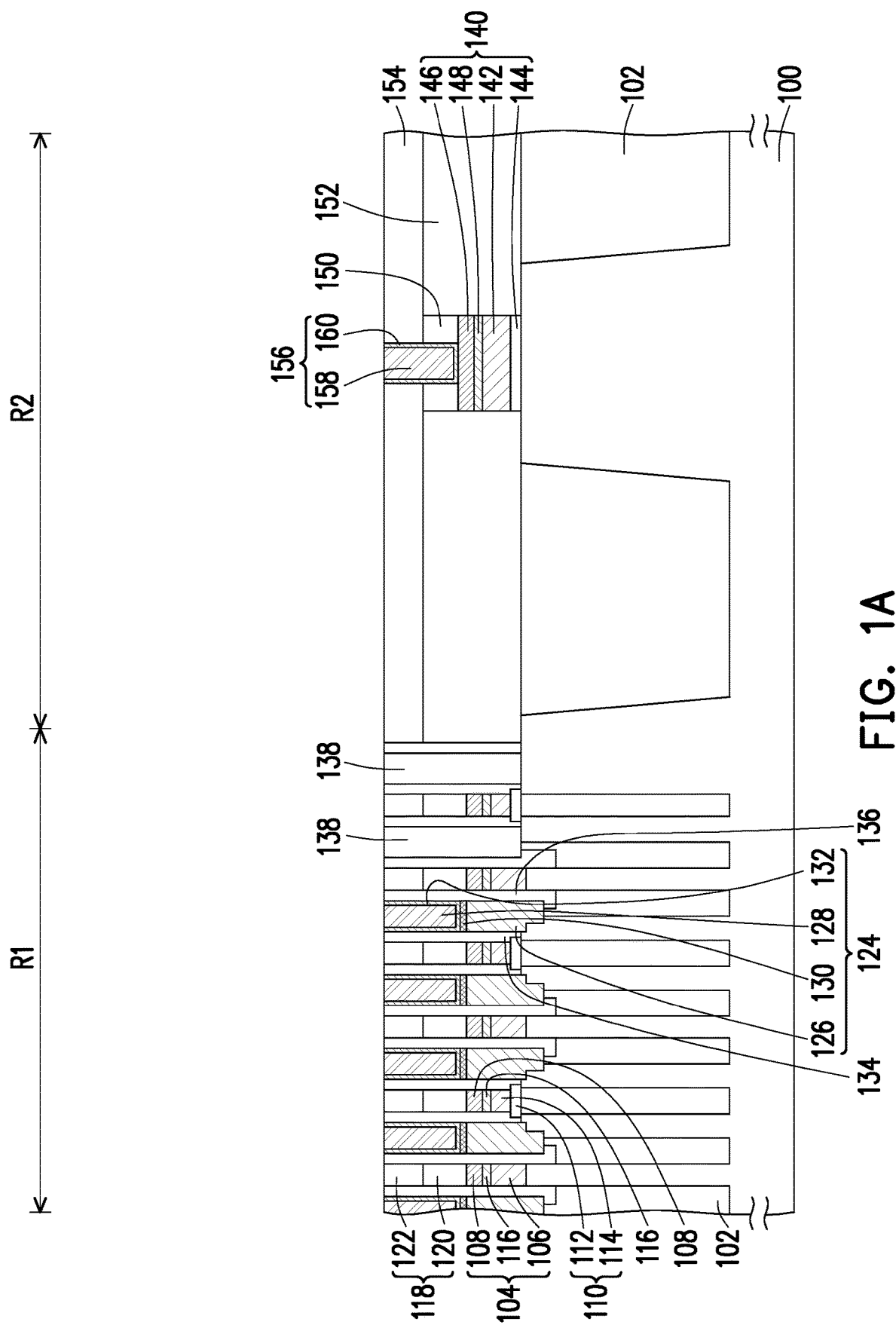

Referring to FIG. 1A, a substrate 100 is provided. The substrate 100 may be a semiconductor substrate such as a silicon substrate. The substrate 100 includes a memory array region R1. In addition, the substrate 100 may further include a peripheral circuit region R2. There may be an isolation structure 102 in the substrate 100. The isolation structure 102 is, for example, a shallow trench isolation (STI) structure. Furthermore, the required doped region (not shown) may be formed in the substrate 100 according to requirements.

A bit line structure 104 is formed in the memory array region R1. The Bit line structure 104 is located on substrate 100. The bit line structure 104 may include a contact 106 and a conductive line 108. The contact 106 is located on the substrate 100. The material of the contact 106 is, for example, doped polysilicon. The conductive line 108 is located on the contact 106. A portion of the conductive line 108 may be located on the dielectric structure 110. The material of the conductive line 108 is, for example, metal such as tungsten. The dielectric structure 110 may be a single-layer structure or a multilayer structure. In the present embodiment, the dielectric structure 110 is, for example, a multilayer structure including a dielectric layer 112 and a dielectric layer 114, but the invention is not limited thereto. The dielectric layer 112 is located on the isolation structure 102. The material of the dielectric layer 112 is, for example, silicon oxide. The dielectric layer 114 is located on the dielectric layer 112. The material of the dielectric layer 114 is, for example, silicon nitride. Moreover, the bit line structure 104 may further include a barrier layer 116. The barrier layer 116 is located between the conductive line 108 and the contact 106. A portion of the barrier layer 116 may be located between the conductive line 108 and the dielectric structure 110. The material of the barrier layer 116 is, for example, titanium (Ti), titanium nitride (TiN), or a combination thereof.

Furthermore, a hard mask layer 118 may be formed on the bit line structure 104. The hard mask layer 118 may be a single-layer structure or a multilayer structure. In the present embodiment, the hard mask layer 118 is, for example, a multilayer structure including a mask layer 120 and a mask layer 122, but the invention is not limited thereto. The mask layer 120 is located on the conductive line 108. The material of the mask layer 120 is, for example, silicon nitride. The mask layer 122 is located on the mask layer 120. The material of the mask layer 122 is, for example, silicon nitride.

In addition, a contact structure 124 is formed in the memory array region R1. The contact structure 124 is located on the substrate 100 on one side of the bit line structure 104. The contact structure 124 may include a contact 126 and a contact 128. The contact 126 is located on the substrate 100. The material of the contact 126 is, for example, doped polysilicon. The contact 128 is located on the contact 126. The material of the contact 128 is, for example, metal such as tungsten. Furthermore, the contact structure 124 may further include at least one of a metal silicide layer 130 and a barrier layer 132. The metal silicide layer 130 is located between the contact 126 and the contact 128. The material of the metal silicide layer 130 is, for example, cobalt silicide (CoSi) or nickel silicide (NiSi). The barrier layer 132 is located between the contact 128 and the metal silicide layer 130. The material of the barrier layer 132 is, for example, Ti, TiN, or a combination thereof.

Moreover, a spacer layer 134 may be formed on one sidewall of the contact structure 124, and a spacer layer 136 may be formed on the other sidewall of the contact structure 124. In addition, the spacer layer 134 may be further located on two sidewalls of the conductive line 108 on the dielectric structure 110, and the spacer layer 136 may be further located on two sidewalls of the bit line structure 104. The spacer layer 134 and the spacer layer 136 may be respectively a single-layer structure or a multilayer structure For example, the spacer layer 134 and the spacer layer 136 may be respectively a silicon nitride layer, a composite layer of silicon oxide layer/silicon nitride layer (NO), or a composite layer of silicon nitride layer/silicon oxide layer/silicon nitride layer (NON).

In addition, a dielectric structure 138 may be formed on the substrate 100 at the edge of the memory array region R1. The dielectric structure 138 may be a single-layer structure or a multilayer structure. The material of the dielectric structure 138 is, for example, silicon oxide, silicon nitride, or a combination thereof.

On the other hand, the gate structure 140 may be formed in the peripheral circuit region R2. The gate structure 140 may include a gate 142 and a dielectric layer 144. The gate 142 is located on substrate 100. The material of the gate 142 is, for example, doped polysilicon. The dielectric layer 144 is located between the gate 140 and the substrate 100. The material of the dielectric layer 144 is, for example, oxide such as silicon oxide. Furthermore, the gate structure 140 may further include a conductive layer 146. The conductive layer 146 is located on the gate 140. The material of the conductive layer 146 is, for example, metal such as tungsten. Moreover, the gate structure 140 may further include a barrier layer 148. The barrier layer 148 is located between the gate 142 and the conductive layer 146. The material of the barrier layer 146 is, for example, Ti, TiN or a combination thereof. In some embodiments, a spacer layer (not shown) may be formed on the sidewall of the gate structure 140.

In addition, a hard mask layer 150 may be formed on the gate structure 140. The material of the hard mask layer 150 is, for example, silicon nitride. Furthermore, a dielectric structure 152 may be formed on two sides of the gate structure 140. The dielectric structure 152 may be a single-layer structure or a multilayer structure. The material of the dielectric structure 152 is, for example, silicon oxide, silicon nitride, or a combination thereof.

On the other hand, a hard mask layer 154 covering the hard mask layer 150 and the dielectric structure 152 may be formed. The material of the hard mask layer 154 is, for example, silicon nitride. Moreover, a contact structure 156 may be formed in the hard mask layer 154 and the hard mask layer 150. The contact structure 156 may be electrically connected to the conductive layer 146. The contact structure 156 may include a contact 158. The material of the contact 158 is, for example, metal such as tungsten. The contact 158 is located in the hard mask layer 154 and the hard mask layer 150. In addition, the contact structure 156 may further include a barrier layer 160. The barrier layer 160 is located between the contact 158 and the conductive layer 146. The material of the barrier layer 160 is, for example, Ti, TiN, or a combination thereof.

Figure 1B:
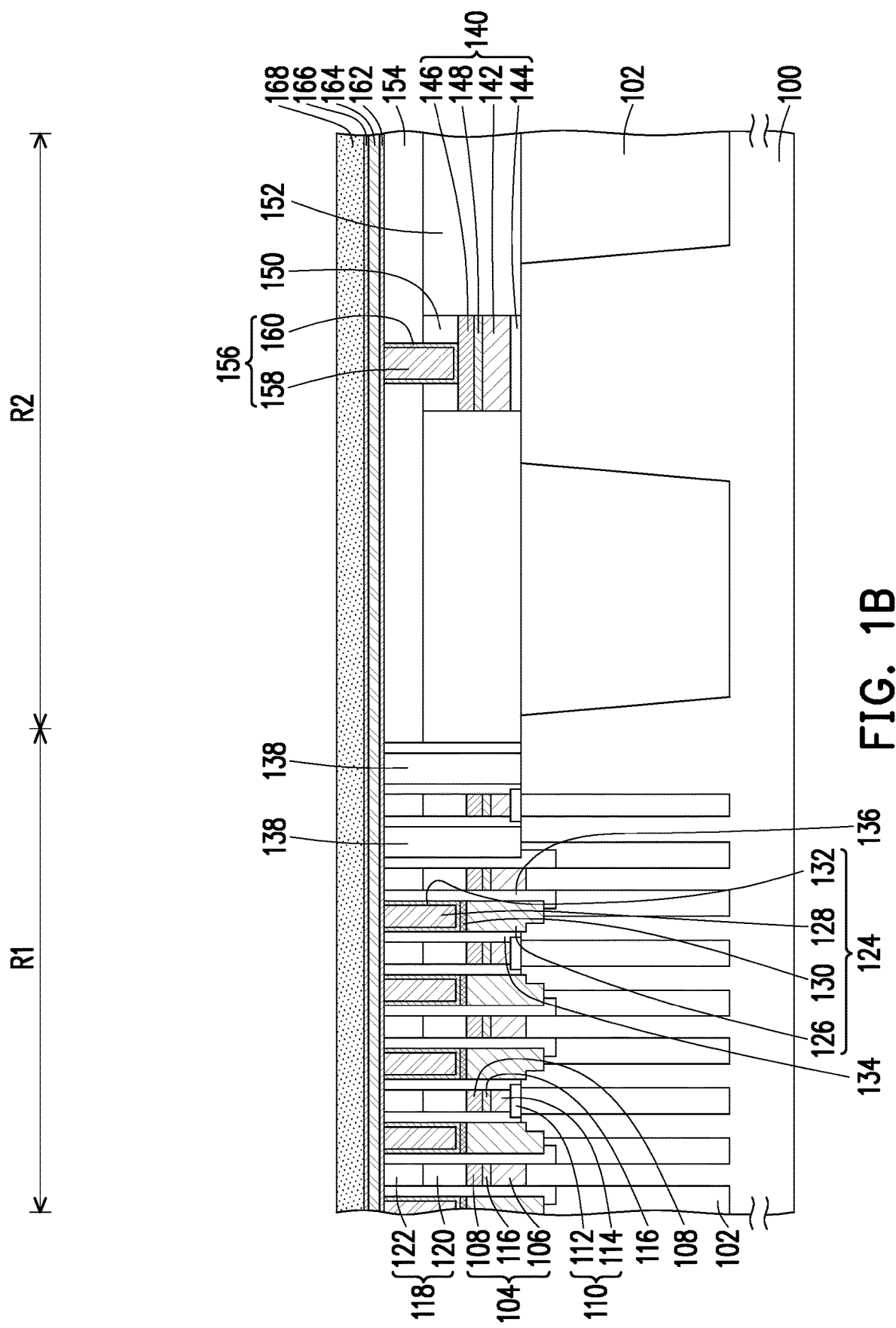

Referring to FIG. 1B, a barrier material layer 162, a conductive material layer 164, a barrier material layer 166, and a sacrificial material layer 168 may be sequentially formed in the memory array region R1 and the peripheral circuit region R2. The material of the barrier material layer 162 and the barrier material layer 166 is, for example, Ti, TiN, or a combination thereof. The material of the conductive material layer 164 is, for example, metal such as tungsten. The material of the sacrificial material layer 168 is, for example, polysilicon. In other embodiments, the barrier material layer 162 and the barrier material layer 166 may be omitted.

Figure 1C:
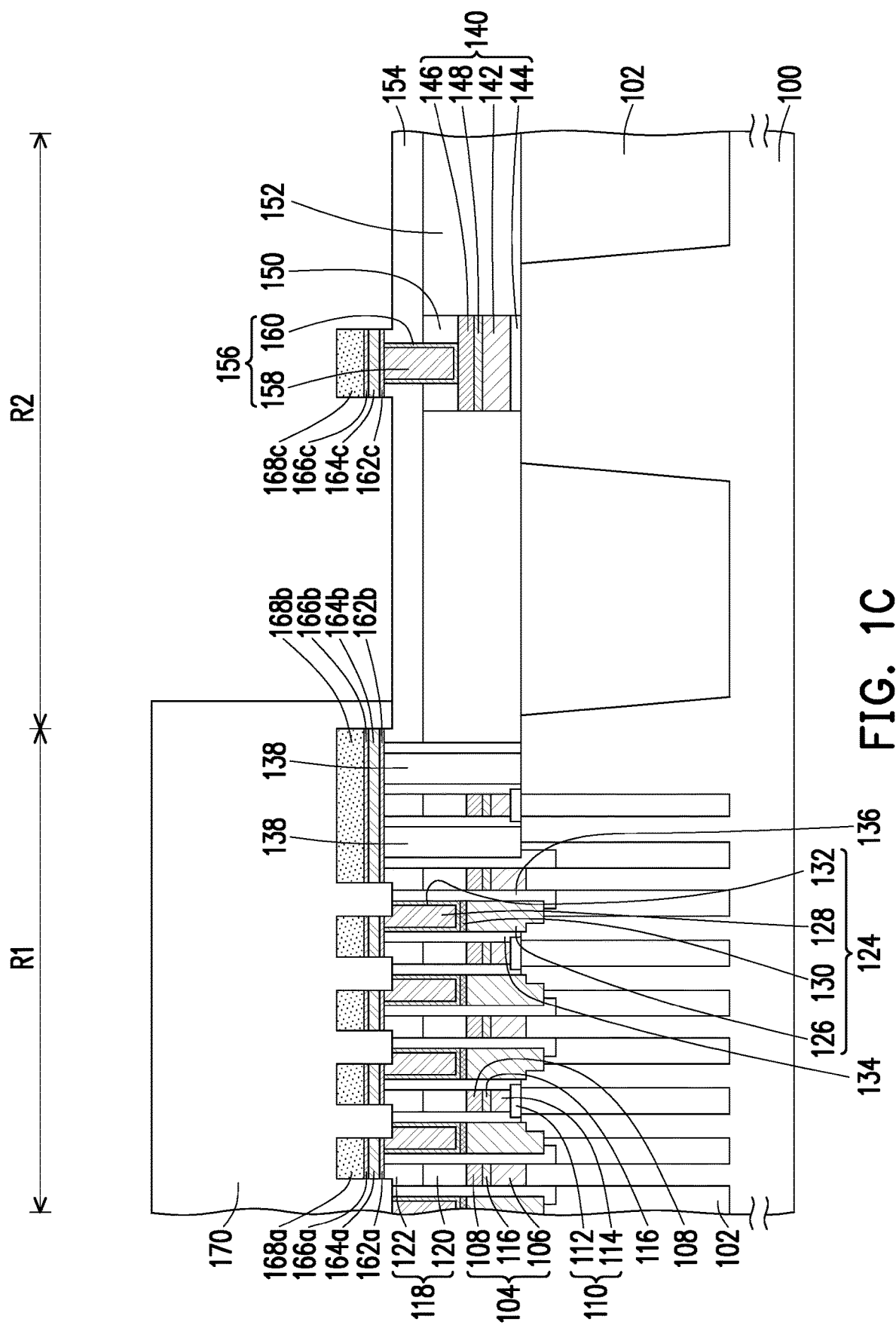

Referring to FIG. 1C, the sacrificial material layer 168, the barrier material layer 166, the conductive material layer 164, and the barrier material layer 162 may be patterned, so that a barrier layer 162a, a conductive layer 164a, a barrier layer 166a, and a sacrificial layer 168a sequentially located above the contact structure 124 are formed in the memory array region R1, a barrier layer 162b, a dummy conductive layer 164b, a barrier layer 166b, and a sacrificial layer 168b that are not located above the contact structure 124 are formed in the memory array region R1, and a barrier layer 162c, a conductive layer 164c, a barrier layer 166c, and a sacrificial layer 168c sequentially located above the contact structure 156 are formed in the peripheral circuit region R2. The conductive layer 164a may be electrically connected to the contact structure 124 via the barrier layer 162a. The dummy conductive layer 164b may be located above the dielectric structure 138. The conductive layer 164c may be electrically connected to the contact structure 156 via the barrier layer 162c. The sacrificial layer 168a, the sacrificial layer 168b, and the sacrificial layer 168c may be respectively located above the conductive layer 164a, the dummy conductive layer 164b, and the conductive layer 164c.

In addition, the method of patterning the sacrificial material layer 168, the barrier material layer 166, the conductive material layer 164, and the barrier material layer 162 may include a lithography process, an etching process, a self-aligned double patterning (SADP) process, a patterning process using a hard mask layer, or a combination thereof. Furthermore, in the above patterning process, a portion of the contact 128, a portion of the barrier layer 132, a portion of the spacer layer 134, a portion of the spacer layer 136, a portion of the mask layer 122, and a portion of the hard mask layer 154 may be removed at the same time.

A patterned photoresist layer 170 may be formed. The patterned photoresist layer 170 covers the sacrificial layer 168a and the sacrificial layer 168b located in the memory array region R1 and exposes the sacrificial layer 168c located in the peripheral circuit region R2. The patterned photoresist layer 170 may be formed by a lithography process.

Figure 1D:
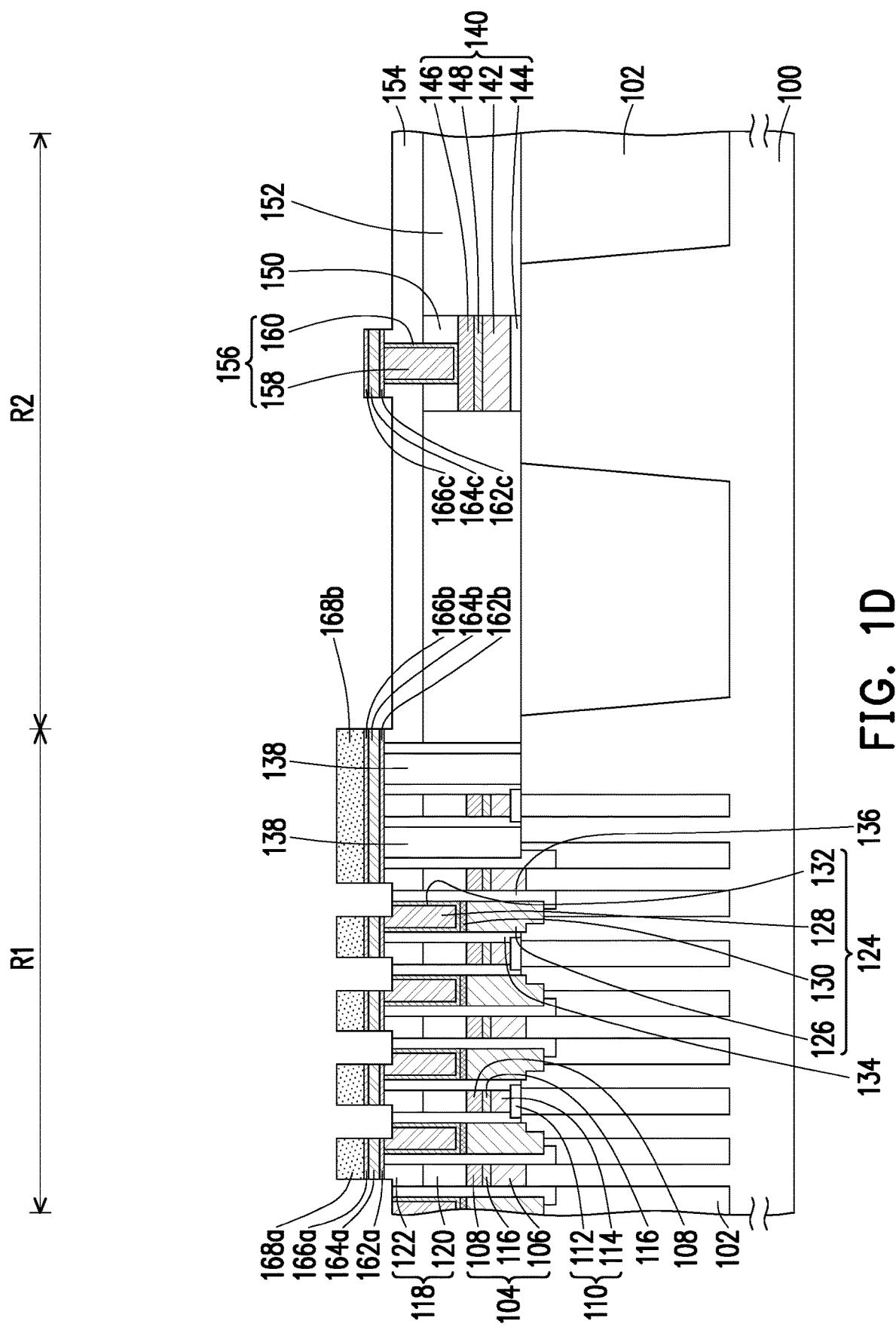

Referring to FIG. 1D, the sacrificial layer 168c located in the peripheral circuit region R2 may be removed by using the patterned photoresist layer 170 as a mask to expose the barrier layer 166c. The patterned photoresist layer 170 may be removed.

Figure 1E:
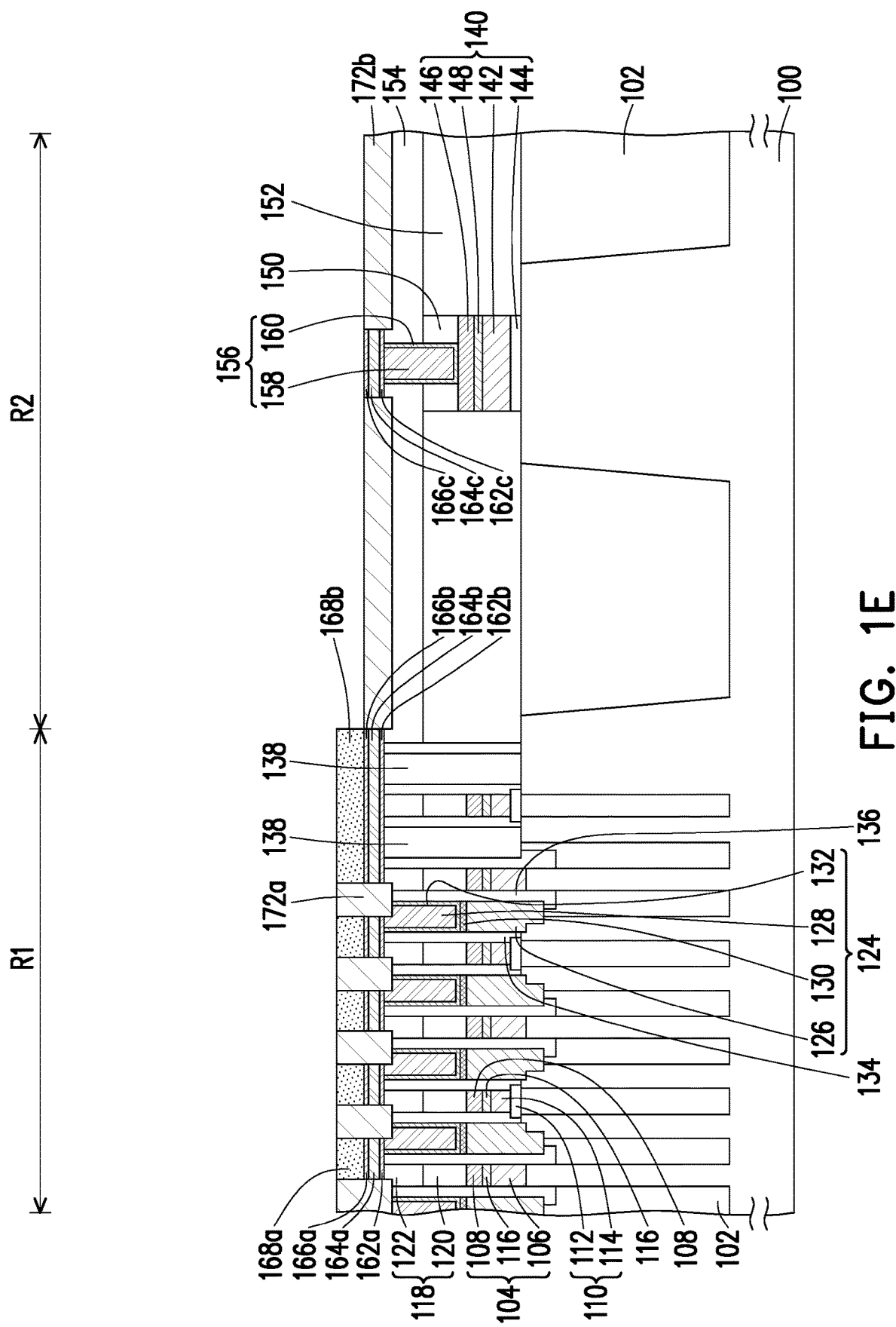
Figure 1F:
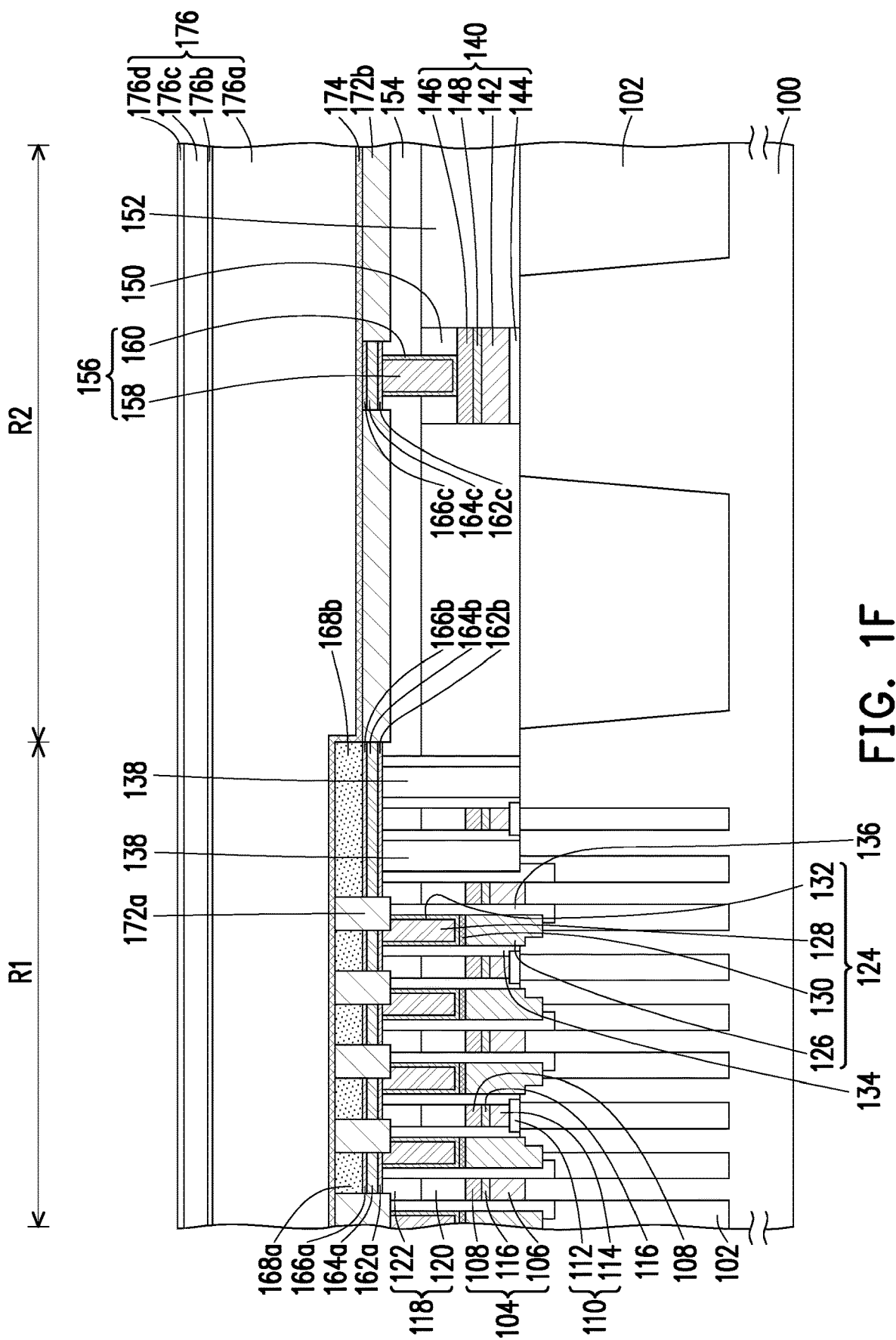

Referring to FIG. 1E, a hard mask layer 172a may be formed between the sacrificial layers 168a and between the sacrificial layer 168a and the sacrificial layer 168b in the memory array region R1. Furthermore, a hard mask layer 172b exposing the barrier layer 166c may be formed on the hard mask layer 154 in the peripheral circuit region R2. The material of the hard mask layer 172a and the hard mask layer 172b is, for example, nitride such as silicon nitride. Referring to FIG. 1F, a stop layer 174 is formed in the memory array region R1 and the peripheral circuit region R2. That is, the stop layer 174 may extend from the memory array region R1 to the peripheral circuit region R2. The stop layer 174 is located above the bit line structure 104, and may be located above the contact structure 124. The stop layer 174 may cover the sacrificial layer 168a, the sacrificial layer 168b, and the hard mask layer 172a located in the memory array region R1, and may cover the barrier layer 166c and the hard mask layer 172b in the peripheral circuit region R2. The material of the stop layer 174 is, for example, nitride such as silicon nitride.

Figure 1G:
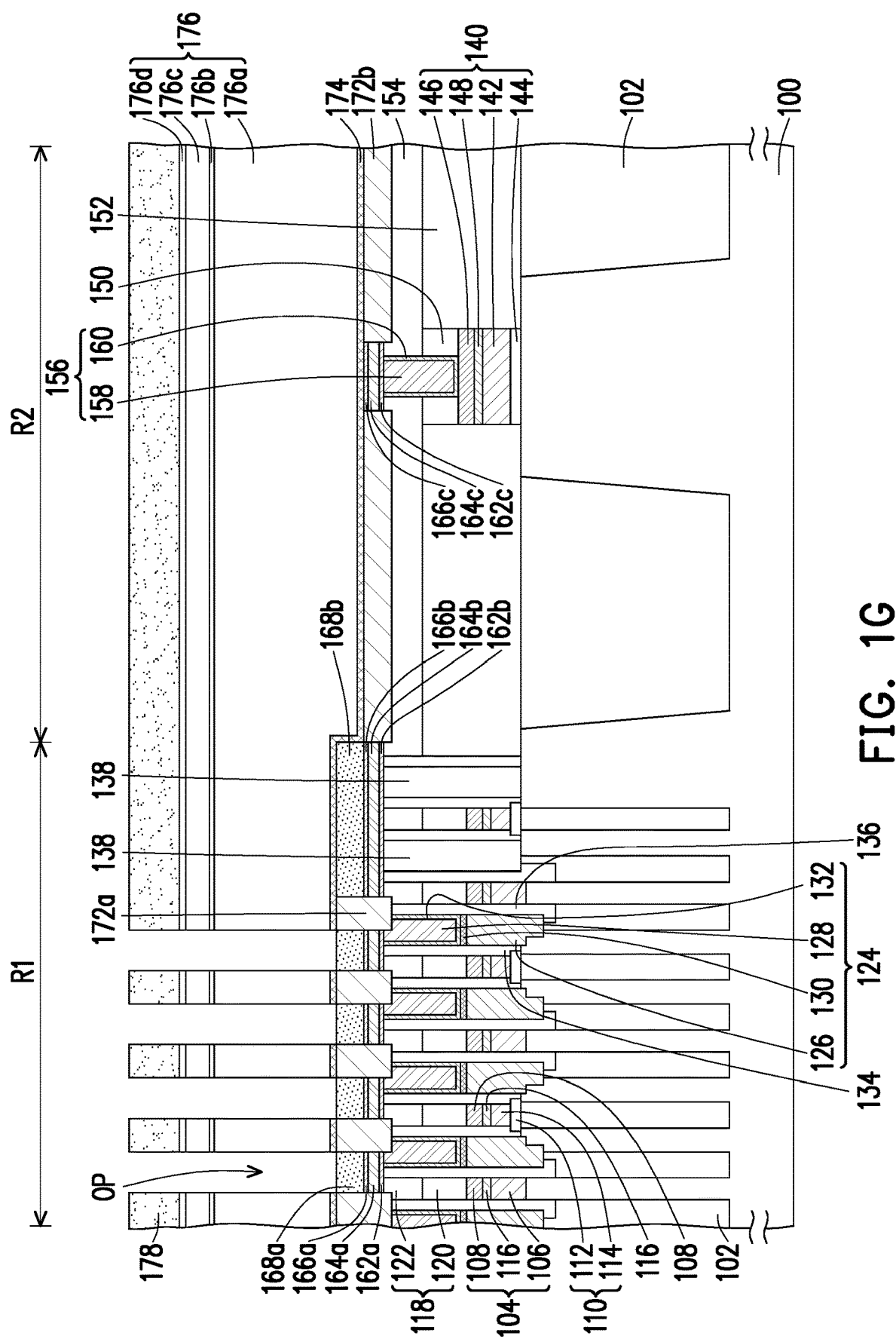

A dielectric structure 176 may be formed on the stop layer 174. The dielectric structure 176 may include a dielectric layer 176a, a dielectric layer 176b, a dielectric layer 176c, and a dielectric layer 176d, but the invention is not limited thereto. The material of the dielectric layer 176a and the dielectric layer 176c is, for example, oxide such as silicon oxide. The material of the dielectric layer 176b and the dielectric layer 176d is, for example, nitride such as silicon nitride. Referring to FIG. 1G, a patterned mask layer 178 may be formed on the dielectric structure 176. The material of the patterned mask layer 178 is, for example, polysilicon.

A portion of the dielectric structure 176 and a portion of the stop layer 174 may be removed by using the patterned mask layer 178 as a mask to form an opening OP in the dielectric structure 176 and the stop layer 174. The opening OP exposes the sacrificial layer 168a located above the contact structure 124. Thereby, the stop layer 174 may be patterned to expose the sacrificial layer 168a located above the contact structure 124. After the stop layer 174 is patterned, the stop layer 174 may cover the sacrificial layer 168b located at the edge of the memory array region R1 and not located above the contact structure 124. The method of removing a portion of the dielectric structure 176 and a portion of the stop layer 174 is, for example, a dry etching method.

Figure 1H:
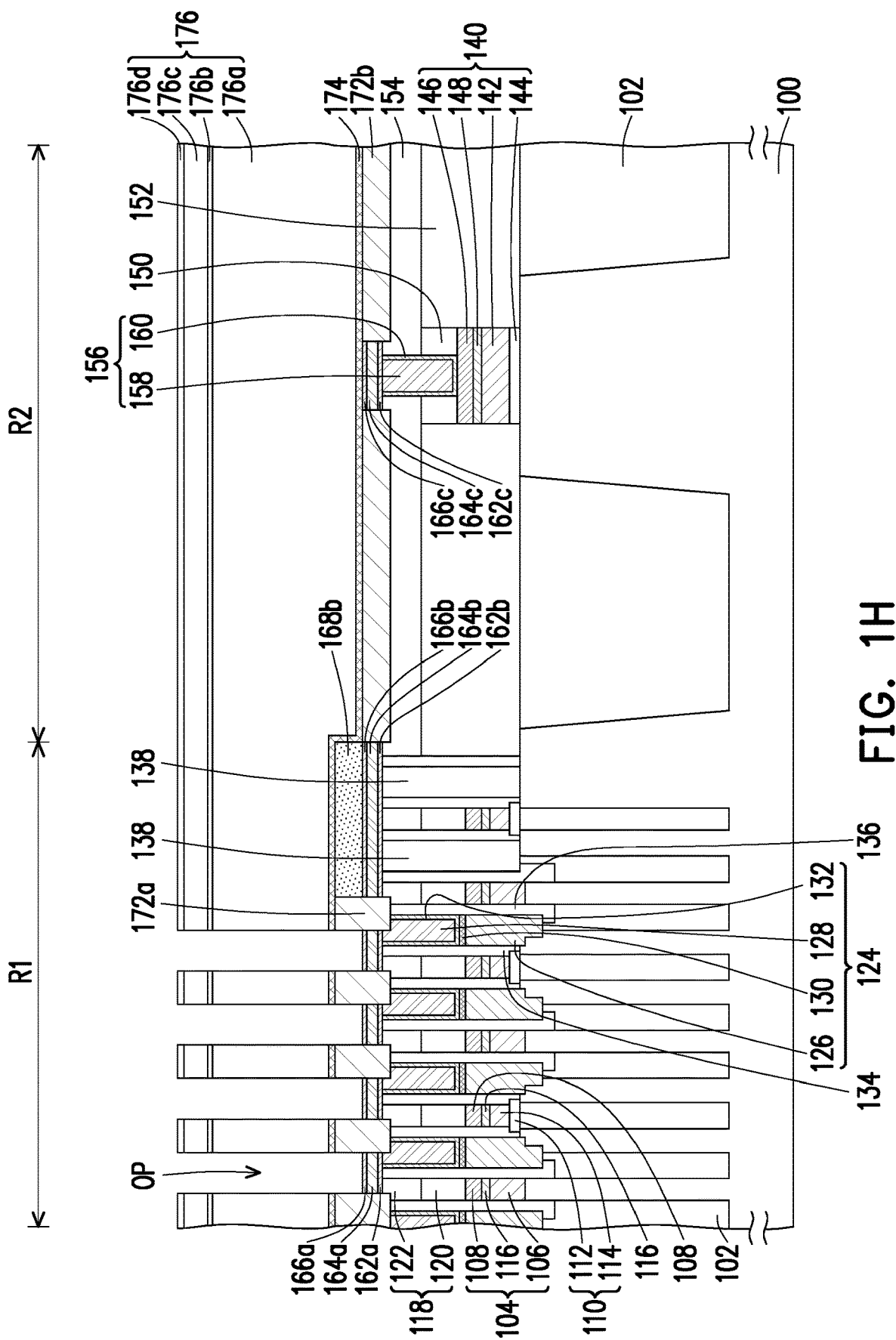
Figure 11:
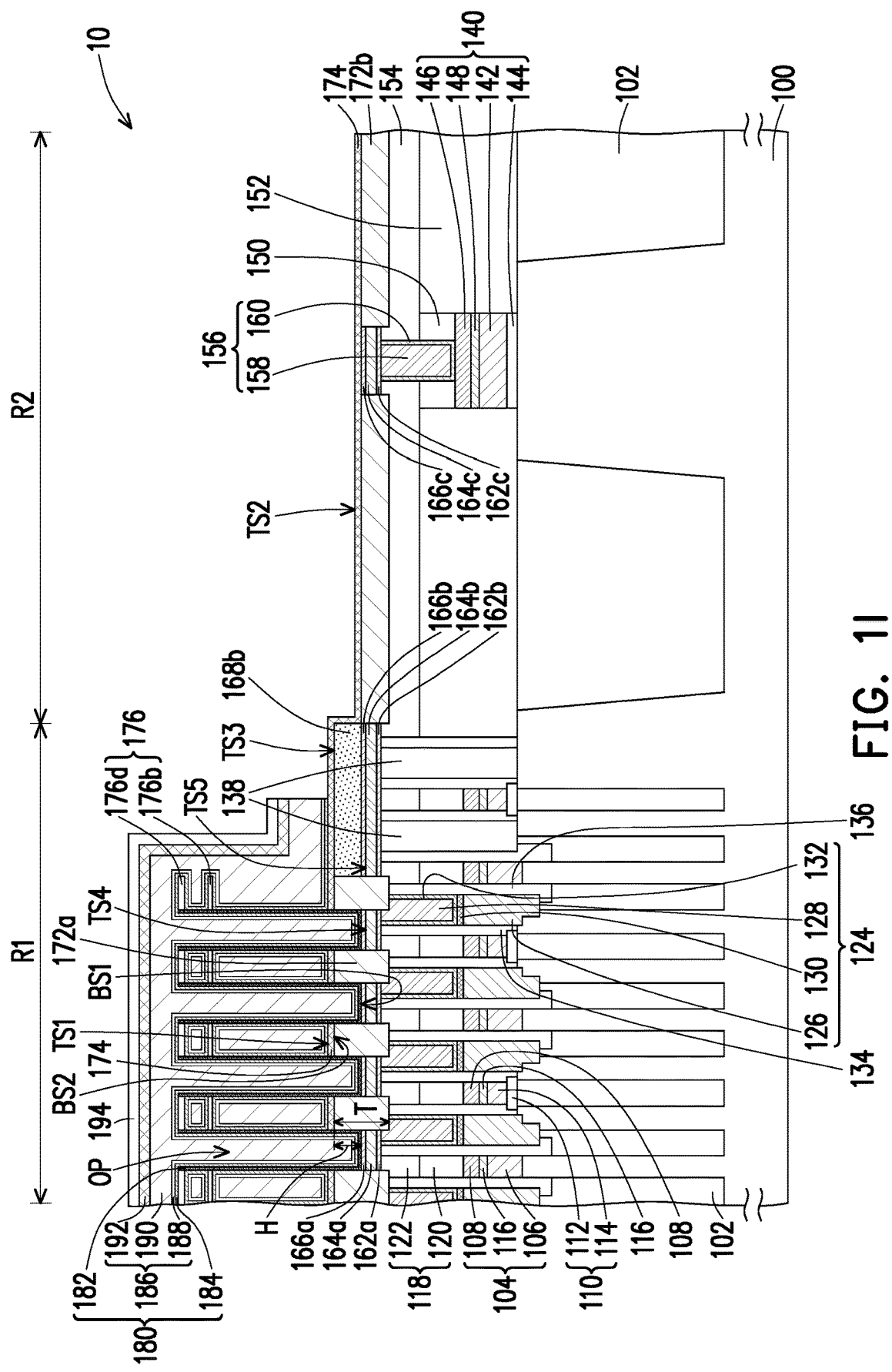

Referring to FIG. 1H, after the stop layer 174 is patterned, the sacrificial layer 168a exposed by the opening OP may be removed, and the sacrificial layer 168b located at the edge of the memory array region R1 and not located above the contact structure 124 may be remained. After the sacrificial layer 168a exposed by the opening OP is removed, the opening OP may extend toward the substrate 100 to increase the depth of the opening OP, thereby increasing the overall height of the capacitor structure 186 (FIG. 1I) that is subsequently formed in the opening OP. The opening OP may expose the barrier layer 166a. Moreover, after the stop layer 174 is patterned, the patterned mask layer 178 may be removed. In some embodiments, when the sacrificial layer 168a and the patterned mask layer 178 have similar etching rates in the etching process, the patterned mask layer 178 may be simultaneously removed in the process of removing the sacrificial layer 168a exposed by the opening OP, but the invention is not limited thereto. In other embodiments, the sacrificial layer 168a and the patterned mask layer 178 may be removed by different etching processes.

Referring to FIG. 1I, a capacitor structure 180 is formed in the memory array region R1. The capacitor structure 180 passes through the stop layer 174 and is electrically connected to the contact structure 124. For example, the capacitor structure 180 may be electrically connected to the contact structure 124 via the barrier layer 166a, the conductive layer 164a, and the barrier layer 162a. In the present embodiment, the capacitor structure 180 may be a cylinder capacitor, but the invention is not limited thereto. In addition, the method of forming the cylinder capacitor is well known to one of ordinary skill in the art, and the description thereof is omitted here. In the process of forming capacitor structure 180, the dielectric structure 176 may be patterned to remain the dielectric structure 176 located in memory array region R1. Furthermore, in the process of forming the capacitor structure 180, the dielectric layer 176a and the dielectric layer 176c of the dielectric structure 176 may be removed.

The capacitor structure 180 includes an electrode 182, an insulating layer 184, and an electrode 186. The material of the electrode 182 is, for example, Ti, TiN, or a combination thereof. The electrode 186 is located on the electrode 182. The insulating layer 184 is located between the electrode 182 and the electrode 186. The material of the insulating layer 184 may be a dielectric material such as a high dielectric constant (high-k) material. The electrode 186 may be a single-layer structure or a multilayer structure. In the present embodiment, the electrode 186 is, for example, a multilayer structure including a conductive layer 188, a conductive layer 190, and a conductive layer 192, but the invention is not limited thereto. The conductive layer 188 is located on the insulating layer 184. The material of the conductive layer 188 is, for example, Ti, TiN, or a combination thereof. The conductive layer 190 is located on the conductive layer 188. The material of the conductive layer 190 is, for example, doped silicon germanium (SiGe). The conductive layer 192 is located on the conductive layer 190. The material of the conductive layer 192 is, for example, metal such as tungsten.

Furthermore, a dielectric layer 194 may be formed on the capacitor structure 180. The material of the dielectric layer 194 is, for example, silicon oxide such as tetraethyl orthosilicate (TEOS) silicon oxide.

Hereinafter, the memory structure 10 of the above embodiment will be described with reference to FIG. 1I. In addition, although the method for forming the memory structure 10 is described by taking the foregoing method as an example, the invention is not limited thereto.

Referring to FIG. 1I, the memory structure 10 includes a substrate 100, a bit line structure 104, a contact structure 124, a stop layer 174, and a capacitor structure 186. The substrate 100 includes a memory array region R1. Furthermore, the substrate 100 may further include a peripheral circuit region R2. The bit line structure 104 is located in the memory array region R1 and located on the substrate 100. The contact structure 124 is located in the memory array region R1 and located on the substrate 100 on one side of the bit line structure 104. The stop layer 174 is located in the memory array region R1 and located above the bit line structure 104. The stop layer 174 may be further located in the peripheral circuit region R2. Moreover, the top surface TS1 of the stop layer 174 located in the memory array region R1 may be higher than the top surface TS2 of the stop layer 174 located in the peripheral circuit region R2. The capacitor structure 186 is located in the memory array region R1 and electrically connected to the contact structure 124. The capacitor structure 186 passes through the stop layer 174 and is electrically connected to the contact structure 124. The bottom surface BS1 of the capacitor structure 186 is lower than the bottom surface BS2 of the stop layer 174, thereby increasing the overall height of the capacitor structure 186, so that the capacitor area of the capacitor structure 186 can be increased. A portion of capacitor structure 186 may be located in the opening OP.

In addition, the memory structure 10 may further include at least one of a sacrificial layer 168*b*, a dummy conductive layer 164*b*, a conductive layer 164*a*, and a hard mask layer 172*a*. The sacrificial layer 168*b* is located at the edge of memory array region R1. The top surface TS3 of the sacrificial layer 168*b* may be the same height as the bottom surface BS2 of the stop layer 174 located above the bit line structure 104. A portion of the stop layer 174 may be directly disposed on the sacrificial layer 168*b*. That is, the stop layer 174 and the sacrificial layer 168*b* may be in direct contact. The dummy conductive layer 164*b* is located at the edge of the memory array region R1. The sacrificial layer 168*b* may be disposed on the dummy conductive layer 164*b*. The conductive layer 164*a* is disposed between the capacitor structure 186 and the contact structure 124. The top surface TS4 of the conductive layer 164*a* may be the same height as the top surface TS5 of the dummy conductive layer 164*b*.

The hard mask layer 172*a* is located between the stop layer 174 and the bit line structure 104. The capacitor structure 186 may be partially located in the hard mask layer 172*a*. Furthermore, the overall height of the capacitor structure 186 may be adjusted by the height H of the capacitor structure 186 located in the hard mask layer 172*a*, thereby increasing the capacitor area of the capacitor structure 186. For example, the height H of the capacitor structure 186 located in the hard mask layer 172*a* may be greater than or equal to one-half of the thickness T of the hard mask layer 172*a*.

For the remaining components in the memory structure 10, reference may be made to the description of the above-mentioned embodiments. Moreover, the material, the arrangement, the forming method, and the effect of each component in the memory structure 10 have been described in detail in the foregoing embodiments, and the description thereof is not repeated here.

Based on the foregoing embodiments, in the memory structure 10 and manufacturing method thereof, since the bottom surface BS1 of the capacitor structure 186 is lower than the bottom surface BS2 of the stop layer 174, the overall height of the capacitor structure 186 can be increased, thereby increasing the capacitor area of the capacitor structure 186. Therefore, the capacitance of the capacitor structure 186 can be effectively increased, thereby improving the electrical performance of the memory device.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A memory structure, comprising:
   a substrate comprising a memory array region;
   a bit line structure located in the memory array region and located on the substrate;
   a contact structure located in the memory array region and located on the substrate on one side of the bit line structure;
   a stop layer located in the memory array region and located above the bit line structure;
   a capacitor structure located in the memory array region, wherein the capacitor structure passes through the stop layer and is electrically connected to the contact structure, and a bottom surface of the capacitor structure is lower than a bottom surface of the stop layer;
   a dummy conductive layer located at the edge of the memory array region; and
   a conductive layer disposed between the capacitor structure and the contact structure, wherein a top surface of the conductive layer is the same height as a top surface of the dummy conductive layer.

2. The memory structure according to claim 1, wherein the substrate further comprises a peripheral circuit region, the stop layer is further located in the peripheral circuit region, and
   a top surface of the stop layer located in the memory array region is higher than a top surface of the stop layer located in the peripheral circuit region.

3. The memory structure according to claim 1, further comprising:
   a sacrificial layer located at an edge of the memory array region, wherein a top surface of the sacrificial layer is the same height as the bottom surface of the stop layer located above the bit line structure.

4. The memory structure according to claim 3, wherein a portion of the stop layer is directly disposed on the sacrificial layer.

5. The memory structure according to claim 3,
   wherein the sacrificial layer is disposed on the dummy conductive layer.

6. The memory structure according to claim 1, further comprising:
   a hard mask layer located between the stop layer and the bit line structure.

7. The memory structure according to claim 6, wherein the capacitor structure is partially located in the hard mask layer, and a height of the capacitor structure located in the hard mask layer is greater than or equal to one-half of a thickness of the hard mask layer.

* * * * *